United States Patent
Park et al.

(10) Patent No.: US 12,218,278 B2
(45) Date of Patent: Feb. 4, 2025

(54) DISPLAY DEVICE

(71) Applicant: Samsung Display Co., Ltd., Yongin-si (KR)

(72) Inventors: Mun Soo Park, Yongin-si (KR); Dong Woo Kim, Yongin-si (KR); Jong Hwan Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 275 days.

(21) Appl. No.: 17/444,460

(22) Filed: Aug. 4, 2021

(65) Prior Publication Data

US 2022/0158035 A1 May 19, 2022

(30) Foreign Application Priority Data

Nov. 19, 2020 (KR) .......................... 10-2020-0155893

(51) Int. Cl.
  *H01L 33/38* (2010.01)
  *H01L 27/15* (2006.01)
  *H01L 33/24* (2010.01)
  *G09G 3/32* (2016.01)

(52) U.S. Cl.
  CPC ............ *H01L 33/38* (2013.01); *H01L 27/156* (2013.01); *H01L 33/24* (2013.01); *G09G 3/32* (2013.01); *G09G 2300/0842* (2013.01)

(58) Field of Classification Search
  CPC ............................... H01L 33/38; H01L 27/156
  See application file for complete search history.

(56) References Cited

U.S. PATENT DOCUMENTS

| | | | |
|---|---|---|---|
| 7,044,628 B2 | 5/2006 | Choi et al. | |
| 7,128,456 B2 | 10/2006 | Yamashita et al. | |
| 7,727,788 B2 | 6/2010 | Han et al. | |
| 9,269,754 B2 | 2/2016 | Lee et al. | |
| 10,153,448 B2 | 12/2018 | Tojo | |
| 10,818,647 B2 | 10/2020 | Kim et al. | |
| 2012/0326181 A1* | 12/2012 | Shibata | H01L 25/0753 257/E33.061 |

(Continued)

FOREIGN PATENT DOCUMENTS

| | | |
|---|---|---|
| JP | 6242121 B2 | 12/2017 |
| JP | 2018-6067 A | 1/2018 |

(Continued)

OTHER PUBLICATIONS

U.S. Office Action dated Jan. 9, 2024, issued in U.S. Appl. No. 17/471,679 (7 pages).

(Continued)

*Primary Examiner* — Eugene Lee
(74) *Attorney, Agent, or Firm* — Lewis Roca Rothgerber Christie LLP

(57) ABSTRACT

Some embodiments of the present disclosure provide a display device including a base layer, a first electrode and a second electrode extending along a first direction on the base layer, and spaced apart from each other in a second direction crossing the first direction, and light emitting elements at least partially overlapping the first electrode and at least partially overlapping the second electrode, wherein at least one of the first electrode and the second electrode includes a concavo-convex portion in which at least a portion of one of the light emitting elements overlaps with respect to a third direction that is perpendicular to the first direction and to the second direction.

10 Claims, 15 Drawing Sheets

(56) References Cited

U.S. PATENT DOCUMENTS

| | | | |
|---|---|---|---|
| 2018/0012876 A1* | 1/2018 | Kim | H01L 33/387 |
| 2018/0019369 A1* | 1/2018 | Cho | H05K 1/181 |
| 2018/0366524 A1 | 12/2018 | Bang et al. | |
| 2019/0096858 A1* | 3/2019 | Woo | H01L 33/62 |
| 2020/0144453 A1 | 5/2020 | Chang et al. | |
| 2021/0159268 A1* | 5/2021 | Heo | H01L 25/0753 |
| 2021/0202796 A1 | 7/2021 | Park et al. | |
| 2021/0202803 A1* | 7/2021 | Park | H01L 33/44 |
| 2021/0265532 A1* | 8/2021 | Itou | H01L 25/0753 |
| 2022/0069003 A1 | 3/2022 | Lee et al. | |
| 2022/0140000 A1* | 5/2022 | Kim | H01L 33/62 257/89 |
| 2023/0230968 A1* | 7/2023 | Lee | H01L 25/0753 257/91 |
| 2023/0238484 A1* | 7/2023 | Park | H01L 33/08 257/79 |

FOREIGN PATENT DOCUMENTS

| | | |
|---|---|---|
| KR | 10-2004-0063385 A | 7/2004 |
| KR | 10-2004-0075361 A | 8/2004 |
| KR | 10-2015-0118662 A | 10/2015 |
| KR | 10-2018-0007025 A | 1/2018 |
| KR | 10-2020-0052512 A | 5/2020 |
| KR | 10-2020-0085977 A | 7/2020 |
| KR | 10-2021-0084789 A | 7/2021 |
| KR | 10-2021-0086807 A | 7/2021 |

OTHER PUBLICATIONS

US Notice of Allowance dated May 31, 2024, issued in U.S. Appl. No. 17/471,679 (10 pages).

* cited by examiner

DISPLAY DEVICE

CROSS-REFERENCE TO RELATED APPLICATION

This application claims priority to, and the benefit of, Korean Patent Application No. 10-2020-0155893 filed in the Korean Intellectual Property Office on Nov. 19, 2020, the entire contents of which are incorporated herein by reference.

BACKGROUND

1. Field

The present disclosure relates to a display device.

2. Description of the Related Art

As interest in information displays largely increases, and as a demand for using a portable information medium increases, demand and commercialization for display devices have increased in priority.

SUMMARY

The present disclosure provides a display device with excellent alignment of light emitting elements.

Some embodiments of the present disclosure provide a display device including a base layer, a first electrode and a second electrode extending along a first direction on the base layer, and spaced apart from each other in a second direction crossing the first direction, and light emitting elements at least partially overlapping the first electrode and at least partially overlapping the second electrode, wherein at least one of the first electrode and the second electrode includes a concavo-convex portion in which at least a portion of one of the light emitting elements overlaps with respect to a third direction that is perpendicular to the first direction and to the second direction.

The concavo-convex portion may include concave portions and convex portions.

The concave portions and the convex portions may be alternately arranged along the first direction.

The portion of the one of the light emitting elements may be located between two adjacent convex portions.

The one of the light emitting elements may include a first end portion that at least partially overlaps the first electrode to be electrically connected to the first electrode, and a second end portion that at least partially overlaps the second electrode to be electrically connected with the second electrode.

The concavo-convex portion may at least partially overlap the first end portion or the second end portion of the one of the light emitting elements.

The concavo-convex portion may include convex portions, and at least one flat portion positioned between two adjacent ones of the convex portions.

The convex portion and the flat portion may be alternately arranged along the first direction.

At least one light emitting element of the light emitting elements may be located on the at least one flat portion.

The one of the light emitting elements may include a first end portion that at least partially overlaps the first electrode to be electrically connected to the first electrode, and a second end portion that at least partially overlaps the second electrode to be electrically connected with the second electrode, wherein the flat portion at least partially overlaps the first end portion or the second end portion of the one of the light emitting elements.

Other embodiments provide a display device including a base layer, a first electrode and a second electrode extending along a first direction on the base layer, and spaced apart from each other in a second direction crossing the first direction, and light emitting elements at least partially overlapping the first electrode and at least partially overlapping the second electrode, wherein at least one of the first electrode and the second electrode includes a protruding portion partially protruding in the second direction, when viewed in a plan view, and wherein at least one of the first electrode and the second electrode includes a concavo-convex portion in which at least a portion of one of the light emitting elements overlaps when viewed in a cross-sectional view that is perpendicular to the first direction and to the second direction.

The protruding portion may include first protruding portions that protrude from the first electrode toward the second electrode along the second direction, and that are spaced apart from each other along the first direction.

The protruding portion may include second protruding portions that protrude from the second electrode toward the first electrode along the second direction, and that are spaced apart from each other along the first direction.

The first protruding portion and the second protruding portion may be spaced apart from each other along the second direction, and are located to face each other.

The first protruding portion and the second protruding portion may be spaced apart from each other along the second direction, and are located to be staggered with respect to each other.

The first protruding portion may include the concavo-convex portion, which includes concave portions and convex portions.

The second protruding portion may include the concavo-convex portion, which includes concave portions and convex portions.

The first protruding portion may include the concavo-convex portion, which includes convex portions, and at least one flat portion positioned between two adjacent ones of the convex portions.

The second protruding portion may include the concavo-convex portion, which includes the convex portions, and at least one flat portion positioned between two adjacent ones of the convex portions.

The light emitting element may include a first end portion that at least partially overlaps the first electrode to be electrically connected to the first electrode, and a second end portion that at least partially overlaps the second electrode to be electrically connected with the second electrode, the first protruding portion at least partially overlaps a first end portion of the light emitting element, and the second protruding portion at least partially overlaps a second end portion of the light emitting element.

According to some embodiments, because light emitting elements are aligned using the first electrode and/or second electrode including concavo-convex portions and/or protruding portions, it is possible to provide a display device with an excellent alignment of the light emitting elements.

Aspects of some embodiments are not limited by what is illustrated in the above, and other aspects are included in the present specification.

DETAILED DESCRIPTION

Figure 1:
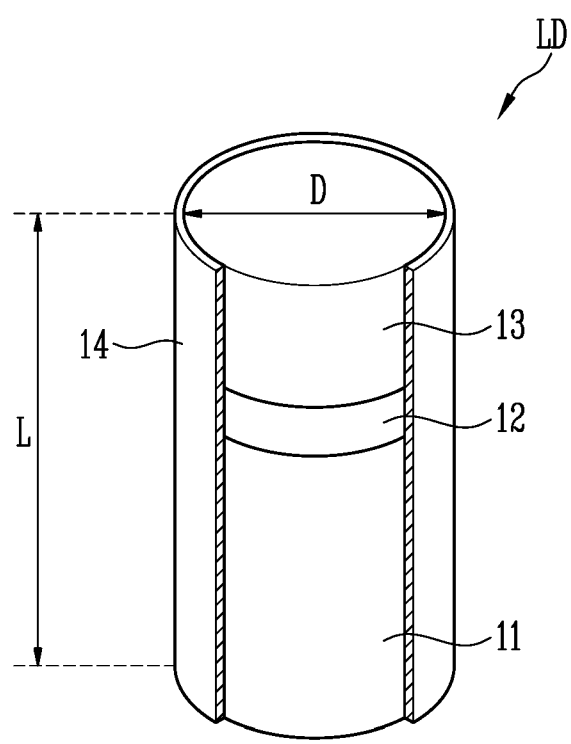
FIG. 1 and FIG. 2 illustrate perspective views of a light emitting element according to some embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts not related to the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions. Hereinafter, a horizontal direction is indicated as a first direction DR1, a vertical direction perpendicular to the horizontal direction is indicated as a second direction DR2, and a direction perpendicular to the first and second directions DR1 and DR2 is indicated as a third direction DR3. In addition, the first direction DR1 and the second direction DR2 correspond to a plan view, and the third direction DR3 means a direction in a cross-sectional view.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, a display device according to some embodiments of the present disclosure will be described with reference to the drawings.

Figure 2:
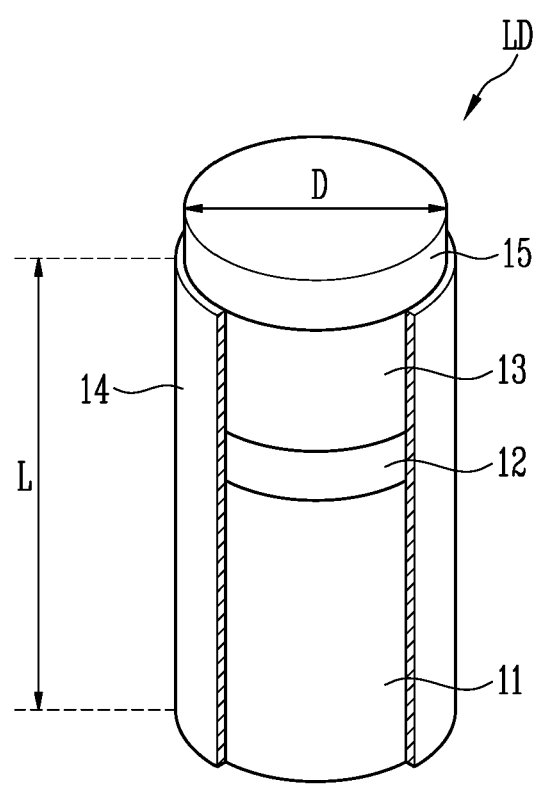

FIG. 1 and FIG. 2 illustrate perspective views of a light emitting element according to some embodiments.

FIG. 1 and FIG. 2 illustrate a light emitting element having a cylindrical shape, but a type and/or shape of the light emitting element according to the present disclosure is not limited thereto.

Referring to FIG. 1 and FIG. 2, a light emitting element LD included in a display device according to some embodiments includes a first semiconductor layer 11, a second semiconductor layer 13, and an active layer 12 located between the first semiconductor layer 11 and the second semiconductor layer 13. For example, the light emitting element LD may be configured of a stacked body in which the first semiconductor layer 11, the active layer 12, and the second semiconductor layer 13 are sequentially stacked along a length direction.

In some embodiments, the light emitting element LD may be provided to have a rod shape extending along one direction, that is, a cylindrical shape. When an extending direction of the light emitting element LD is referred to as a length L direction, the light emitting element LD may be provided with two end portions along the length L direction.

In some embodiments, one of the first and second semiconductor layers 11 and 13 may be located at one end portion of the light emitting element LD, and the other of the first and second semiconductor layers 11 and 13 may be located at the other end portion of the light emitting element LD.

In some embodiments, the light emitting element LD may be a rod-shaped light emitting diode manufactured in a rod shape. In the present specification, "rod shape" refers to a rod-like shape or bar-like shape (e.g., with an aspect ratio that is greater than 1) that is long in the length L direction, such as a circular cylinder or a polygonal cylinder, but a shape of a cross section thereof is not particularly limited. For example, the length L of the light emitting element LD may be larger than a diameter D thereof (or a width of a lateral cross-section thereof). However, the present disclosure is not limited thereto, and in some embodiments, the light emitting element LD may have a short (e.g., with an aspect ratio that is smaller than 1) rod or bar shape in the length L direction. In addition, according to other embodiments, the light emitting element LD may have a rod or bar shape of which the length L and the diameter D are the same.

In some embodiments, the light emitting element LD may have a size as small as nano-scale or micro-scale. The light emitting element LD may have the diameter D and/or the length L ranging from a nano scale to a micro scale. For example, the length L of the light emitting element LD may be about 100 nm to about 10 μm, the diameter D of the light emitting element LD may be about 2 μm to about 6 μm, and the aspect ratio of the light emitting element LD may range from about 1.2 to about 100. However, the size of the light emitting element LD in the present disclosure is not limited thereto. For example, the size of the light emitting element LD may be variously changed according to design conditions of various devices using a light emitting device using the light emitting element LD as a light source, for example, a display device.

The first semiconductor layer 11 may include at least one n-type semiconductor layer. For example, the first semiconductor layer 11 may include a semiconductor material of one of InAlGaN, GaN, AlGaN, InGaN, AlN, and/or InN, and may include a n-type semiconductor layer doped with a first conductive dopant such as Si, Ge, Sn, or the like. However, the material included in the first semiconductor layer 11 is not limited thereto, and the first semiconductor layer 11 may be made of various materials.

The active layer 12 is located on the first semiconductor layer 11, and may be formed to have a single or multi-quantum well (MQW) structure. In some embodiments, a clad layer doped with a conductive dopant may be formed at an upper portion and/or a lower portion of the active layer 12. For example, the clad layer may be formed as an AlGaN layer or an InAlGaN layer. In some embodiments, a material such as AlGaN and/or InAlGaN may be used to form the active layer 12, and in addition, various materials may form the active layer 12.

When a voltage of a threshold voltage or more is applied to respective ends of the light emitting element LD, the light emitting element LD emits light while electron-hole pairs are combined in the active layer 12. By controlling the light emission of the light emitting element LD by using this principle, the light emitting element LD may be used as a light source for various light emitting devices in addition to pixels of a display device.

The second semiconductor layer 13 is located on the active layer 12, and may include a semiconductor layer of a type that is different from that of the first semiconductor layer 11. For example, the second semiconductor layer 13 may include at least one p-type semiconductor layer. For example, the second semiconductor layer 13 may include at least one semiconductor material of InAlGaN, GaN, AlGaN, InGaN, AlN, and/or InN, and may include a p-type semiconductor layer doped with a second conductive dopant such as Mg, Zn, Ca, Sr, or Ba. However, the material included in the second semiconductor layer 13 is not limited thereto, and the second semiconductor layer 13 may be formed of various materials.

In the above-described embodiments, it is described that each of the first semiconductor layer 11 and the second semiconductor layer 13 are formed as one layer, but the present disclosure is not limited thereto. In some embodiments, each of the first semiconductor layer 11 and the second semiconductor layer 13 may further include one or more layers, for example, a cladding layer and/or a tensile strain barrier reducing (TSBR) layer according to the material of the active layer 12. The TSBR layer may be a strain reducing layer located between semiconductor layers having different lattice structures and serving as a buffer to reduce a difference in lattice constant. The TSBR layer may be formed of a p-type semiconductor layer such as p-GaInP, p-AlInP, or p-AlGaInP, but the present disclosure is not limited thereto. In addition, in some embodiments, the light emitting element LD may further include an insulation film 14 provided on a surface thereof. The insulation film 14 may be formed on the surface of the light emitting element LD so as to surround an outer circumferential surface of the active layer 12, and may further surround one area of the first and second semiconductor layers 11 and 13. However, the insulation film 14 may expose respective end portions of the light emitting element LD having different respective polarities. For example, the insulation film 14 may not cover, but may instead expose, respective ends of the first semiconductor layer 11 and the second semiconductor layer 13 located at respective ends of the light emitting element LD in the length L direction, for example, two base surfaces of a cylindrical shape (upper and lower surfaces of the light emitting element LD).

In some embodiments, the light emitting element LD may further include an additional component in addition to the first semiconductor layer 11, the active layer 12, the second semiconductor layer 13, and the insulation film 14. For example, the light emitting element LD may additionally include one or more of a phosphor layer, an active layer, a semiconductor layer, and/or an electrode located on one end side of the first semiconductor layer 11, the active layer 12, and the second semiconductor layer 13.

An electrode 15 located on one side surface of the light emitting element LD shown in FIG. 2 may be an ohmic contact electrode or a Schottky contact electrode, but is not limited thereto. In addition, the electrode 15 may include a metal or a metal oxide, and for example, Cr, Ti, Al, Au, Ni, ITO, IZO, ITZO, and/or an oxide thereof or an alloys thereof may be used alone or in combination therein. In addition, in some embodiments, the electrode 15 may be substantially transparent or translucent. Accordingly, light generated by the light emitting element LD may pass through the electrode 15 to be emitted to the outside of the light emitting element LD.

In some embodiments, the insulation film 14 may or may not at least partially cover an outer circumferential surface of the electrode 15. That is, the insulation film 14 may be selectively formed on a surface of (e.g., a portion of a surface of) the electrode 15. In addition, the insulation film 14 may be formed to expose respective ends of the light emitting element LD having different polarities, and for example, may expose at least one area of the electrode 15. In some embodiments, the insulation film 14 may be omitted from the end portion of the light emitting element LD.

When the insulation film 14 is provided on a surface of the light emitting element LD, for example, on a surface of the active layer 12, it is possible to reduce or prevent the likelihood of the active layer 12 being short-circuited with at least one other electrode (for example, at least one of the contact electrodes connected to respective ends of the light emitting element LD). Therefore, electrical stability of the light emitting element LD may be secured.

In addition, when the insulation film 14 is formed on the surface of the light emitting element LD, it is possible to improve life-span and efficiency thereof by reducing or minimizing surface defects of the light emitting element LD. In addition, when the insulation film 14 is formed on each light emitting element LD, it is possible to reduce or prevent the likelihood of an unwanted short circuit between the light emitting elements LD even when a plurality of the light emitting elements LD are located in close contact with each other.

Further, in some embodiments of the present disclosure, the light emitting element LD may be manufactured through a surface treatment process. For example, when a plurality of the light emitting elements LD are mixed with a fluid solution (or a solvent) and supplied to each light emitting area (for example, a light emitting area of each pixel), respective light emitting elements LD may be surface-treated so that the light emitting elements LD are not non-uniformly aggregated in the solution, and are instead uniformly distributed.

The light emitting element LD may be used in various types of devices that require a light source, including a display device. For example, by using at least one light emitting element LD (e.g., a plurality of light emitting elements LD each having a size of nano-scale or micro-scale in each pixel area of the display device), it is possible to configure a light source (or light source unit) of each pixel. However, the application field of the light emitting element LD in the present disclosure is not limited to the display device. For example, the light emitting element LD may be used in other types of devices that require a light source, such as a lighting device.

Hereinafter, referring to FIG. 3, a display device including a pixel will be described.

Figure 3:
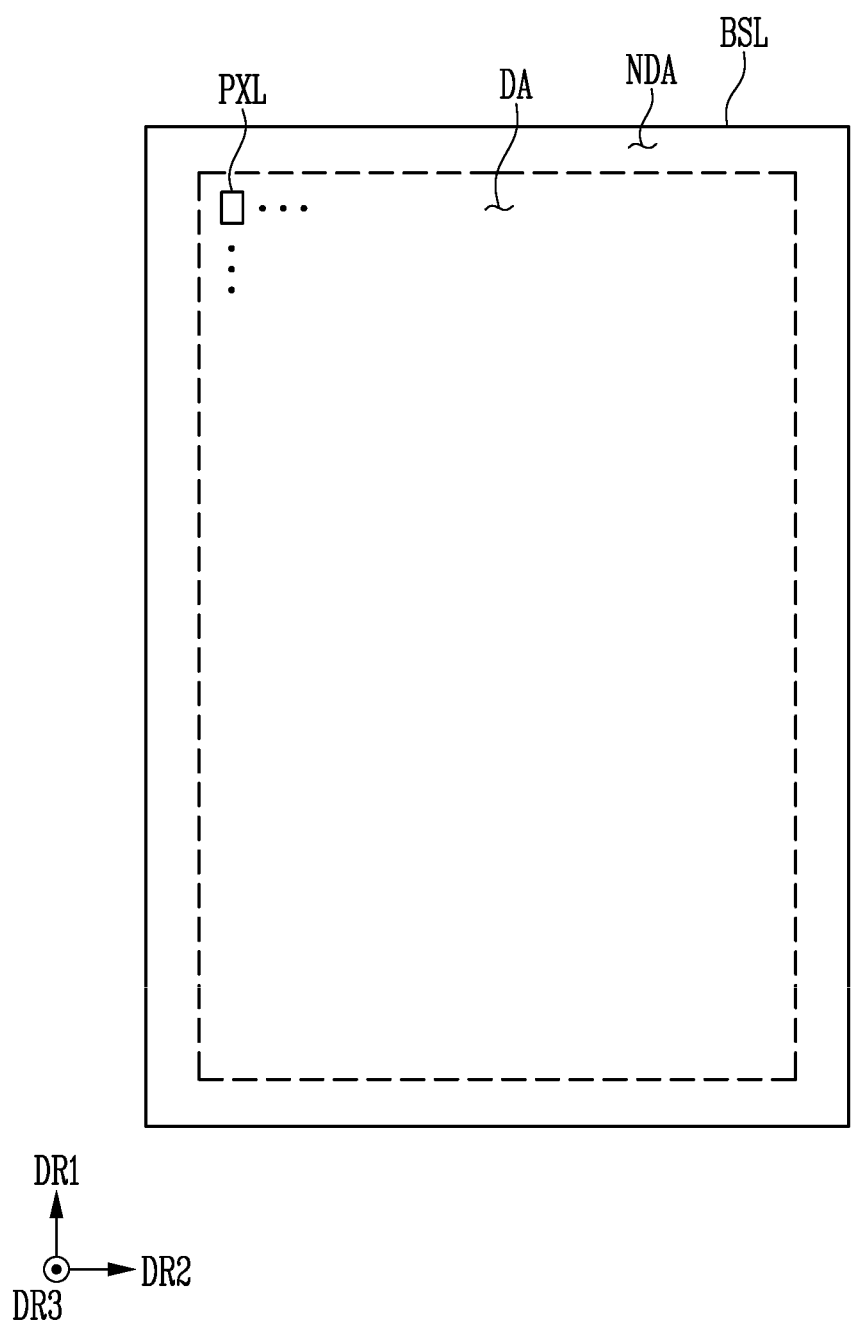
FIG. 3 illustrates a top plan view of a display device according to some embodiments.

FIG. 3 illustrates a top plan view of a display device according to some embodiments.

FIG. 3 illustrates an example of a display device that may use the light emitting element LD described in FIG. 1 and FIG. 2 as a light source, and pixels PXL of the display device may include at least one light emitting element LD.

Referring to FIG. 3, the display device according to some embodiments may include a base layer BSL, and a plurality of pixels PXL located on the base layer BSL.

For example, the display device and the base layer BSL for forming the same include a display area DA for displaying an image, and a non-display area NDA excluding the display area DA. The non-display area NDA may be a bezel area surrounding the display area DA.

The base layer BSL may configure a base member of the display device. In some embodiments, the base layer BSL may be a rigid or flexible substrate or film, and its material or physical properties are not particularly limited. For example, the base layer BSL may be formed as a rigid substrate made of glass or tempered glass, as a flexible substrate (or a thin film) made of a plastic or metallic material, or as at least one layer of insulation film, but its material and/or physical properties are not particularly limited. In addition, the base layer BSL may be transparent, but is not limited thereto. For example, the base layer BSL may be a transparent, translucent, opaque, or reflective base member.

The display area DA may be located on one surface of the display device. For example, the display area DA may be located on a front side of the display device, and may additionally be located on a side or rear surface of the display device.

The non-display area NDA is located around the display area DA to surround the display area DA, and may selectively include wires, pads, driving circuits, etc. connected to the pixels PXL of the display area DA.

For better understanding and ease of description, only one pixel PXL is shown in FIG. 3, but a plurality of pixels PXL may be dispersed and located in or throughout the display area DA. For example, the pixels PXL may be located in the display area DA in a matrix, stripe, RGBG, or PenTile®/ PENTILE® arrangement structure (PENTILE® is a registered trademark of Samsung Display Co., Ltd., Republic of Korea). However, the present disclosure is not limited thereto.

Hereinafter, a connection relationship in one pixel of a display device according to some embodiments will be described with reference to FIG. 4.

Figure 4:
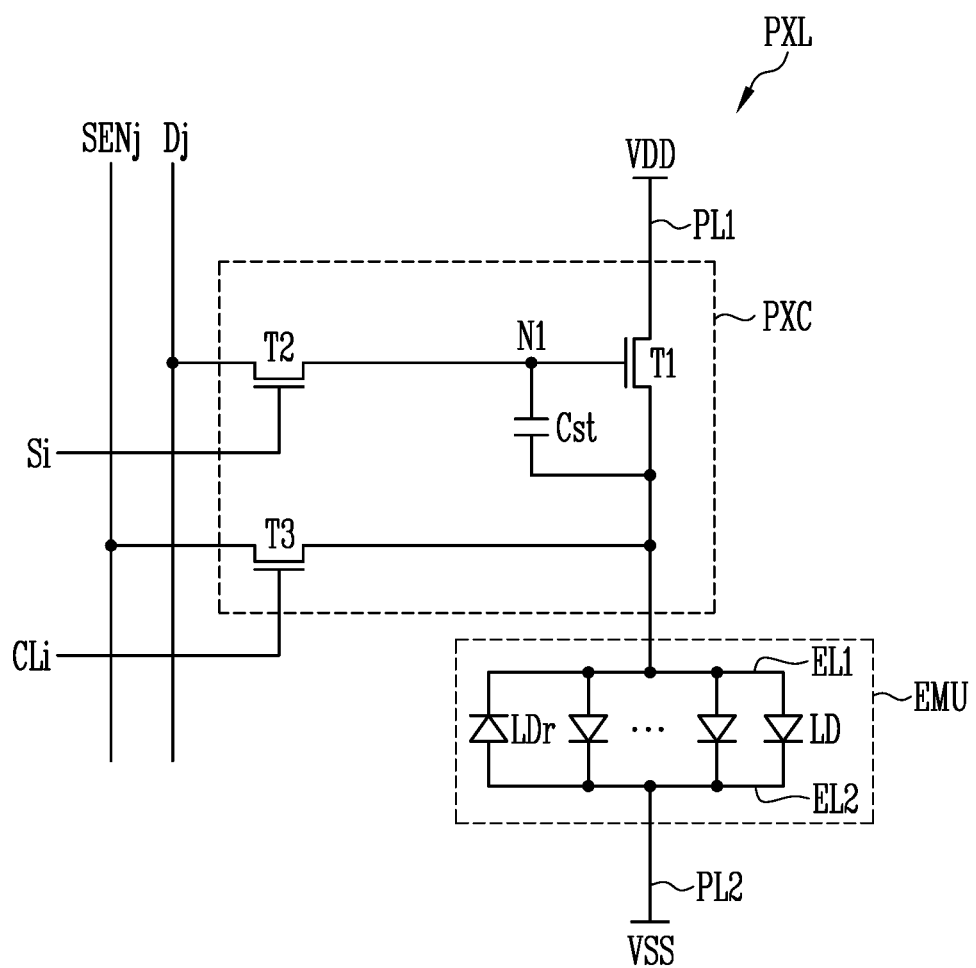
FIG. 4 illustrates a circuit diagram of an electrical connection relationship between constituent elements included in one pixel of a display device according to some embodiments.

FIG. 4 illustrates a circuit diagram of an electrical connection relationship between constituent elements included in one pixel of a display device according to some embodiments.

Referring to FIG. 4, the pixel PXL may include a light emitting unit (e.g., one or more light emitting elements LD) EMU that generates luminance/light corresponding to a data signal. In addition, the pixel PXL may further selectively include a pixel circuit PXC for driving the light emitting unit EMU.

In some embodiments, the light emitting unit EMU includes a plurality of light emitting elements LD connected in parallel between a first power line PL1 to which a voltage of a first driving power source VDD is applied, and a second power line PL2 to which a voltage of a second driving power source VSS is applied.

For example, the light emitting unit EMU may include a first electrode EL1 connected to the first power source VDD via the pixel circuit PXC and the first power line PL1, a second electrode EL2 connected to the second power source VSS through the second power line PL2, and a plurality of light emitting elements LD connected in parallel (e.g., in the same direction) between the first and second electrodes EL1 and EL2. In some embodiments, the first electrode EL1 may be an anode, and the second electrode EL2 may be a cathode.

Each of the light emitting elements LD included in the light emitting unit EMU may include one end portion connected to the first driving power source VDD through the first electrode EL1, and the other end portion connected to the second driving power source VSS through the second electrode EL2.

The first driving power source VDD and the second driving power source VSS may have different potentials. For example, the first driving power source VDD may be set as a high potential power source, and the second driving power source VSS may be set as a low potential power source. In this case, a potential difference between the first and second driving power sources VDD and VSS may be set to be equal to or higher than a threshold voltage of the light emitting elements LD during a light emitting period of the pixel PXL.

As described above, respective light emitting elements LD connected in parallel in the same direction (for example, a forward direction) between the first electrode EL1 and the second electrode EL2 respectively supplied with voltages of different potentials may form respective effective light sources. These effective light sources may be collected to form the light emitting unit EMU of the pixel PXL.

In some embodiments, the light emitting unit EMU may further include at least one ineffective light source, for example, a reverse light emitting element LDr, in addition to the light emitting elements LD forming respective effective light sources. The reverse light emitting element LDr is connected in parallel between the first and second electrodes EL1 and EL2 together with the light emitting devices LD forming the effective light sources, but is connected between the first and second electrodes EU and EL2 in the opposite direction with respect to the other light emitting elements LD. The reverse light emitting element LDr maintains an inactive state even when a driving voltage, or predetermined driving voltage (for example, a driving voltage in the forward direction), is applied between the first and second electrodes EU and EL2, thus a current does not substantially flow in the reverse light emitting element LDr.

The light emitting elements LD of the light emitting unit EMU may emit light with luminance corresponding to a driving current supplied through the corresponding pixel circuit PXC. For example, during each frame period, the pixel circuit PXC may supply a driving current corresponding to a gray value of corresponding frame data to the light emitting unit EMU. The driving current supplied to the light emitting unit EMU may be divided to flow in each of the light emitting elements LD. Therefore, while each light emitting element LD emits light with a luminance corresponding to the current flowing therein, the light emitting unit EMU may emit light having a luminance corresponding to the driving current.

The pixel circuit PXC is connected to a scan line Si and a data line Dj of the pixel PXL. For example, when the pixel PXL is located in an i-th (i is a natural number) row and a j-th (j is a natural number) column of the display area DA, the pixel circuit PXC of the pixel PXL may be connected to an i-th scan line Si and a j-th data line Dj of the display area DA. In addition, the pixel circuit PXC may be connected to an i-th control line CLi and a j-th sensing line SENj of the display area DA.

The pixel circuit PXC may include first to third transistors T1 to T3, and a storage capacitor Cst.

A first terminal of the first transistor T1 (driving transistor) is connected to the first driving power supply source VDD, and a second terminal thereof is electrically connected to the first electrode EL1. A gate electrode of the first transistor T1 is connected to a first node N1. Accordingly, the first transistor T1 may control an amount of driving current supplied to the light emitting elements LD in response to a voltage of the first node N1.

A first terminal of the second transistor T2 (switching transistor) is connected to the data line Dj, and a second terminal thereof is connected to the first node N1. A gate electrode of the second transistor T2 is connected to the scan line Si. The second transistor T2 is turned on when a scan signal of a turn-on voltage (e.g., of a high level) is supplied from the scan line Si, and electrically connects the data line Dj and the first node N1. In this case, a data signal of a corresponding frame is supplied to the data line Dj, and accordingly, the data signal is transmitted to the first node N1. The data signal transmitted to the first node N1 is charged in the storage capacitor Cst.

The third transistor T3 is connected between the first transistor T1 and the sensing line SENj. For example, a first terminal of the third transistor T3 is connected to the first terminal of the first transistor T1, and a second terminal of the third transistor T3 is connected to the sensing line SENj. A gate electrode of the third transistor T3 is connected to the control line CLi. The third transistor T3 is turned on by a control signal (high level) of a gate-on voltage supplied to the control line CLi during a sensing period (e.g., a predetermined sensing period) to electrically connect the sensing line SENj to the first transistor T1. The sensing period may be a period for extracting characteristic information (for example, a threshold voltage of the first transistor T1) of one or more of the pixels PXL located in the display area DA.

One electrode of the storage capacitor Cst is connected to the first node N1, and the other electrode thereof is connected to a second terminal of the first transistor T1. The storage capacitor Cst may be charged with a voltage corresponding to a voltage difference between a voltage corresponding to a data signal supplied to the first node N1, and a voltage of the second terminal of the first transistor T1, and the storage capacitor Cst may maintain the charged voltage until a data signal of a subsequent frame is supplied.

FIG. 4 discloses some embodiments in which all of the first to third transistors T1 to T3 are N-type transistors, but the present disclosure is not limited thereto. In some embodiments, at least one of the first to third transistors T1 to T3 may be a P-type transistor.

In addition, although FIG. 4 discloses some embodiments in which the light emitting unit EMU is connected between the pixel circuit PXC and the second driving power source VSS, the light emitting unit EMU may also be connected between the first driving power source VDD and the pixel circuit PXC in other embodiments.

In addition, FIG. 4 illustrate some embodiments in which the light emitting elements LD forming each light emitting unit EMU are all connected in parallel, but the present disclosure is not limited thereto. In some embodiments, the light emitting unit EMU may be configured to include at least one series stage including a plurality of light emitting elements LD connected in parallel to each other. That is, the light emitting unit EMU may be configured to have a serial/parallel mixed structure.

Hereinafter, a disposition structure of the above-described light emitting element will be described with reference to FIG. 5 and FIG. 6.

Figure 5:
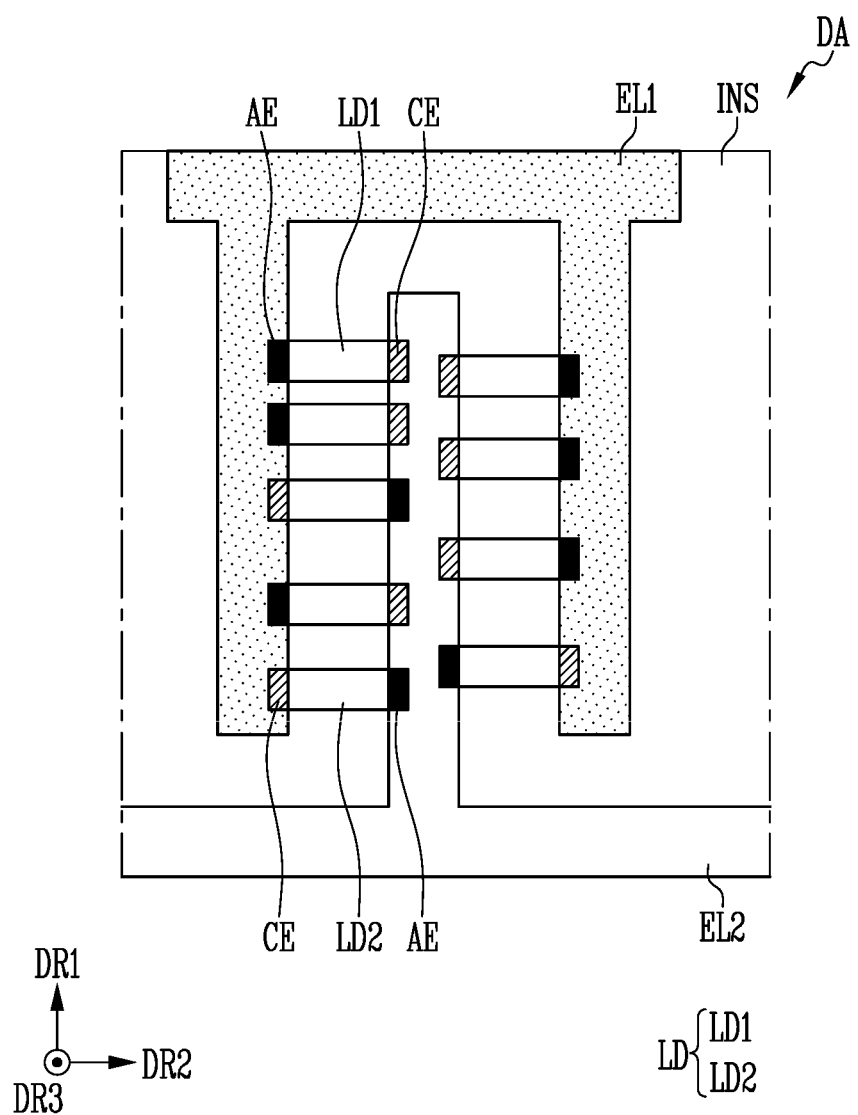
FIG. 5 illustrates a schematic top plan view of an example in which the light emitting elements of FIG. 1 are aligned.
Figure 6:
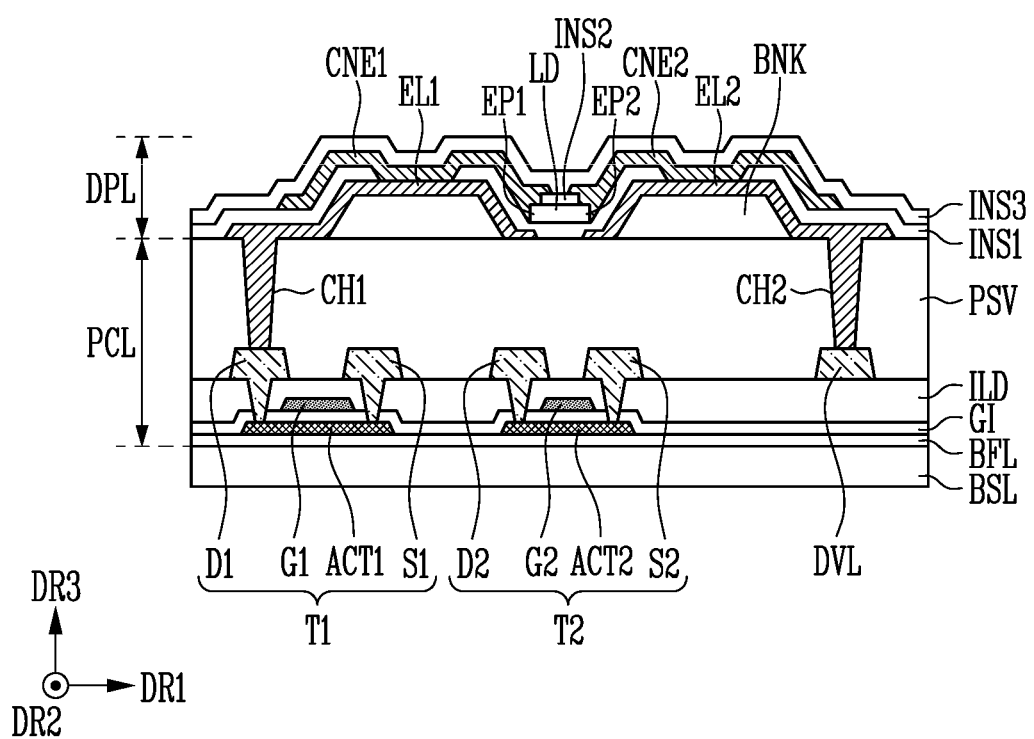
FIG. 6 illustrates a schematic cross-sectional view of a display device according to some embodiments.

FIG. 5 illustrates a schematic top plan view of an example in which the light emitting elements of FIG. 1 are aligned, and FIG. 6 illustrates a schematic cross-sectional view of a display device according to some embodiments.

The top plan view shown in FIG. 5 shows a portion of the display area DA of FIG. 3, and in some embodiments, the display area DA of FIG. 3 may be an area representing one pixel PXL (or a pixel area in which one pixel PXL is located).

Referring to FIG. 5, the display device according to some embodiments may include the first electrode EL1, the second electrode EL2, and the plurality of light emitting elements LD. In some embodiments, each light emitting element LD may be a diode element. For example, an electrode of one end of the light emitting element LD may be an anode AE, and an electrode of the other end thereof may be a cathode CE.

The first electrode EL1 and the second electrode EL2 are located on an insulation layer (e.g., a predetermined insulation layer) INS. Pixel circuits, which may include wires for driving the pixel PXL, may be formed and located under the insulation layer INS. The pixel circuits may be electrically connected to the first electrode EL1 or the second electrode EL2 through a contact hole penetrating through the insulation layer INS. The first and second electrodes EL1 and EL2 may be used as driving electrodes for driving the light emitting elements LD after the light emitting elements LD are aligned. In addition, the first electrode EL1 (or first alignment electrode) and the second electrode EL2 (or second alignment electrode) may be used as alignment electrodes for aligning the light emitting elements LD in each pixel PXL.

The first electrode EL1 and the second electrode EL2 may be spaced apart from each other. In some embodiments, a voltage of a high-potential first driving power source (VDD in FIG. 4) may be supplied to the first electrode EL1, and a voltage of a low-potential second driving power source (VSS in FIG. 4) may be supplied to the second electrode EL2.

In some embodiments, the light emitting element LD may be provided between areas in which the first electrode EL1 and the second electrode EL2 are located (for example, in a respective light emitting area). For example, the light emitting element LD may be prepared in a form dispersed in a solution (e.g., a predetermined solution) to be supplied onto, or to be partially on, the first electrode EL1 and the second electrode EL2 by using an inkjet method or the like.

A polarity direction of the light emitting element LD may be randomly determined according to a probability distribution (for example, Gaussian probability distribution). For example, as shown in FIG. 5, the light emitting element LD may include a first polarity direction light emitting element LD1 and a second polarity direction light emitting element LD2. The light emitting elements LD are randomly arranged, and a ratio of the first polarity light emitting element LD1 and the second polarity light emitting element LD2 may be different for each pixel PXL.

Hereinafter, the insulation layer INS and a driving circuit layer PCL on which the light emitting element LD is located will be described in detail.

Referring to FIG. 6, the pixel PXL according to some embodiments, and the display device including the pixel PXL, include the base layer BSL, and include the driving circuit layer PCL and a display element layer DPL that are located on one surface of the base layer BSL. In addition, the above-described display area DA of FIG. 3 may include the driving circuit layer PCL located on one surface of the base layer BSL, and the display element layer DPL located on the driving circuit layer PCL. However, in some embodiments, mutual positions of the driving circuit layer PCL and the display element layer DPL on the base layer BSL may be changed.

The driving circuit layer PCL includes at least one transistor, a storage capacitor, and a plurality of wires connected thereto. In addition, the driving circuit layer PCL includes a buffer layer BFL, a gate insulation layer GI, an interlayer insulation layer ILD, and/or a passivation layer PSV, which are sequentially stacked on one surface of the base layer BSL.

The buffer layer BFL located on a front surface of the base layer BSL may include an inorganic insulation material. The buffer layer BFL may reduce or prevent impurities that may otherwise spread to transistors and capacitors.

A semiconductor layer is located on the buffer layer BFL. The semiconductor layer includes first and second active layers ACT1 and ACT2 of the first and second transistors T1 and T2. The first active layer ACT1 may include a channel area overlapping a first gate electrode G1 to be described later, and a source area and a drain area located on respective sides of the channel area. The second active layer ACT2 may include a channel area overlapping a second gate electrode G2 to be described later, and a source area and a drain area located on respective sides of the channel area. The first and second active layers ACT1 and ACT2 may be made of polysilicon, amorphous silicon, or an oxide semiconductor.

The gate insulation layer GI is located on the semiconductor layer. The gate insulation layer GI may include an inorganic material including a silicon oxide ($SiO_x$), a silicon nitride ($SiN_x$), or a silicon oxynitride ($SiO_xN_y$). However, the present disclosure is not limited thereto, and the gate insulation layer GI according to embodiments may be an organic insulation layer including an organic material.

A gate conductor/gate conductor layer is located on the gate insulation layer GI. The gate conductor includes the first gate electrode G1 and the second gate electrode G2. The first gate electrode G1 may be located to overlap the channel area of the first active layer ACT1. The second gate electrode G2 may be located to overlap the channel area of the second active layer ACT2. The gate conductor may further include a gate electrode of each transistor among a plurality of transistors included in the driving circuit layer PCL, one electrode of a storage capacitor, a gate line, and the like.

The interlayer insulation layer ILD is located on the gate conductor. The interlayer insulation layer ILD may include the same material as the gate insulation layer GI, or may include at least one or more of the materials exemplified in the gate insulation layer GI. For example, the interlayer insulation layer ILD may be an inorganic insulation layer including an inorganic material.

A first data conductor is positioned on the interlayer insulation layer ILD. The first data conductor includes first electrodes D1 and D2 and second electrodes S1 and S2, which are respectively of the first and second transistors T1 and T2. The first electrode D1 of the first transistor T1 may be a drain electrode connected to the drain area of the first active layer ACT1, and the second electrode S1 thereof may be a source electrode connected to the source area of the first active layer ACT1. The first electrode D2 of the second transistor T2 may be a drain electrode connected to the drain area of the second active layer ACT2, and the second electrode S2 thereof may be a source electrode connected to the source area of the second active layer ACT2. In addition, the first electrodes D1 and D2 may be the source electrodes of the first and second transistors T1 and T2, and the second electrodes S1 and S2 may be the drain electrodes thereof.

The first data conductor includes a driving voltage wire DVL. The driving voltage wire DVL may have the same configuration as the second power line PL2 described with reference to FIG. 4. Therefore, a voltage of the second driving power source VSS may be applied to the driving voltage wire DVL. In some embodiments, the driving circuit layer PCL may further include a first power line connected to the first driving power source VDD. The first power line may be electrically connected to one configuration or portion of the display element layer DPL, for example, to the first electrode EL1, and the driving voltage wire DVL may be electrically connected to the other configuration of the display element layer DPL, for example, to the second electrode EL2.

In the present example, it has been described that the driving voltage wire DVL is located on the same layer as the first electrode D1 and D2 and the second electrode S1 and S2 of the first and second transistors T1 and T2, but the present disclosure is not limited thereto. In some embodiments, the driving voltage wire DVL may be located on the same layer as one of other conductive layers provided in the driving circuit layer PCL.

The first data conductor may further include a first electrode and a second electrode of each transistor among a plurality of transistors, and may further include the other electrode of the storage capacitor and a data line.

The passivation layer PSV is located on the first data conductor. The passivation layer PSV may include at least one organic insulation layer, and may substantially flatten a surface of the driving circuit layer PCL. The passivation layer PSV may be configured of a single film or of a multi-film, and may include an inorganic insulation material and an organic insulation material. For example, the passivation layer PSV may include at least one of a polyacrylates resin, an epoxy resin, a phenolic resin, a polyamides resin, and a polyimides resin.

The display element layer DPL is located on the driving circuit layer PCL including the passivation layer PSV. A first contact hole CH1 of the passivation layer PSV may connect the first electrode D1 of the first transistor T1 of the driving circuit layer PCL and the first electrode EU of the display element layer DPL. A second contact hole CH2 of the passivation layer PSV may connect the driving voltage wire DVL of the driving circuit layer PCL and the second electrode EL2 of the display element layer DPL. Accordingly, the voltage of the first driving power source VDD may be applied to the first electrode EL1, and the voltage of the second driving power source VSS may be applied to the second electrode EL2.

The display element layer DPL includes the light emitting element LD of the pixels PXL, and electrodes connected to the light emitting element LD. The light emitting element LD may be an ultra-small inorganic light emitting diode having a nano-scale or micro-scale structure formed by growing a nitride-based semiconductor.

The display element layer DPL includes a bank BNK, the first electrode EL1, the second electrode EL2, a first insulation layer INS1, a second insulation layer INS2, a first contact electrode CNE1, a second contact electrode CNE2, and a third insulation layer INS3.

The bank BNK is located on the passivation layer PSV. The bank BNK may be located in an area (for example, a light emitting area) in which light is emitted from each pixel PXL. The bank BNK is located under a portion of the first electrode EL1 and the second electrode EL2 so as to guide the light emitted from the light emitting element LD in an image display direction (for example, in an upper direction of each pixel PXL, or in the third direction DR3) of the display device, so that it may allow a portion of the first electrode EL1 and the second electrode EL2 to protrude in a upper direction, that is, in the third direction DR3. The bank BNK may include an inorganic insulation film made of an inorganic material, or an organic insulation film made of an organic material. In some embodiments, the bank BNK may include an organic insulation film of a single film, or an inorganic insulation film of a single film, but is not limited thereto.

Each of the first electrode EL1 and the second electrode EL2 is located on the bank BNK, and has a surface corresponding to a shape of the bank BNK. The first electrode EL1 and the second electrode EL2 may include a material having a substantially uniform reflectivity. Accordingly, the light emitted from the light emitting element LD by the first electrode EL1 and the second electrode EL2 may proceed in the image display direction (third direction DR3) of the display device.

The first electrode EL1 may be electrically connected to the first electrode D1 of the first transistor T1 through the first contact hole CH1 penetrating through the passivation layer PSV. The second electrode EL2 may be electrically connected to the driving voltage wire DVL through the second contact hole CH2 penetrating through the passivation layer PSV. In some embodiments, the first electrode EL1 may be an anode, and the second electrode EL2 may be a cathode. The present disclosure is not limited thereto, and the first electrode EL1 may be a cathode, and the second electrode EL2 may be an anode in other embodiments.

The first insulation layer INS1 is located between the passivation layer PSV and each of the first electrode EL1 and the second electrode EL2. The first insulation layer INS1 may stably support the light emitting element LD by filling a space between the light emitting element LD and the passivation layer PSV. The first insulation layer INS1 may include at least one of an inorganic insulation film and an organic insulation film, and may be configured of a single film or a multi-film.

The light emitting element LD is located on the first insulation layer INS1. At least one light emitting element LD may be located between the first electrode EU and the second electrode EL2. In some embodiments, the plurality of light emitting elements LD may be located between the first electrode EL1 and the second electrode EL2, and the plurality of light emitting elements LD may be connected in parallel to each other. Disposition of the light emitting elements LD may correspond to the light emitting elements LD of FIG. 5.

Each of the light emitting elements LD may emit light (e.g., light of a predetermined color), such as white light and/or blue light. In some embodiments, the light emitting elements LD may be prepared in a form capable of being sprayed into a solution to be injected into each pixel PXL.

After the solution is sprayed, an alignment voltage (e.g., a predetermined alignment voltage, or alignment signal) may be applied to the first electrode EL1 and the second electrode EL2, such that the light emitting elements LD may be aligned between the first electrode EL1 and the second electrode EL2.

When the alignment voltage (or alignment signal) is applied to the first electrode EL1 and the second electrode EL2, self-alignment of the light emitting elements LD may be induced due to an electric field formed between the first electrode EL1 and the second electrode EL2.

In addition, when the light emitting elements LD are aligned, by controlling the alignment voltage (or alignment signal) applied to the first electrode EU and the second electrode EL2, or by forming a magnetic field, the light emitting elements LD may be arranged to be relatively biased between the first electrode EL1 and the second electrode EL2. For example, a first end portion EP1 of the light emitting element LD may be aligned to be directed to the first electrode EL1, and a second end portion EP2 thereof may be aligned to be directed to the second electrode EL2.

In the process of aligning the light emitting element LD, when the light emitting element LD is not uniformly aligned between the first electrode EL1 and the second electrode EL2, because a density of the light emitting elements LD provided per unit area is non-uniform, luminance of the display device may decrease, and stains may occur on the display device. Accordingly, in the display device according to some embodiments, the light emitting elements are aligned using an electrode having concavo-convex portions and/or protruding portions, thereby providing a display device with an excellent alignment of the light emitting elements. The shape of the aligned electrodes will be described in detail with reference to FIG. 7 and drawings following FIG. 7 to be described later.

In some embodiments, the light emitting element LD may correspond to the light emitting element LD of FIG. 1 to FIG. 5 described above.

The second insulation layer INS2 is located on a portion of the light emitting element LD. The second insulation layer INS2 may cover a portion of an upper surface of each of the light emitting elements LD, and may expose the first end portion EP1 and the second end portion EP2 of the light emitting element LD. The second insulation layer INS2 may stably fix the light emitting element LD. When there is an empty space between the first insulation layer INS1 and the light emitting element LD before the formation of the second insulation layer INS2, the empty space may be at least partially filled with the second insulation layer INS2.

The first contact electrode CNE1 that electrically and/or physically connects the first electrode EL1 to one of respective end portions of the light emitting element LD (for example, the first end portion EP1) is located on the first electrode EL1. The first contact electrode CNE1 may be located to partially overlap the first insulation layer INS1, the second insulation layer INS2, and the light emitting element LD. The first insulation layer INS1 may be removed in a portion in which the first electrode EL1 and the first contact electrode CNE1 are connected to each other, that is, in a portion in which the first electrode EU and the first contact electrode CNE1 directly contact each other.

The second contact electrode CNE2 that electrically and/or physically connects the second electrode EL2 to one of respective end portions of the light emitting element LD (for example, the second end portion EP2) is located on the second electrode EL2. The second contact electrode CNE2 may be located to partially overlap the first insulation layer INS1, the second insulation layer INS2, and the light emitting element LD. The first insulation layer INS1 may be removed in a portion in which the second electrode EL2 and the second contact electrode CNE2 are connected to each other, that is, in a portion in which the second electrode EL2 and the second contact electrode CNE2 directly contact each other.

The first contact electrode CNE1 and the second contact electrode CNE2 may be made of a transparent conductive material. For example, the first contact electrode CNE1 and the second contact electrode CNE2 may include materials such as an indium tin oxide (ITO), an indium zinc oxide (IZO), and/or an indium tin zinc oxide (ITZO). Accordingly, the light emitted from the light emitting element LD and reflected by the first electrode EL1 and the second electrode EL2 may proceed in the image display direction (e.g., the third direction DR3) of the display device.

The third insulation layer INS3 is located on the first contact electrode CNE1 and the second contact electrode CNE2. The third insulation layer INS3 may include at least one organic film or inorganic film, and may be entirely located to cover the surface of the display element layer DPL.

Hereinafter, the first electrode and the second electrode used as alignment electrodes will be described with reference to FIG. 7 to FIG. 12.

Figure 7:
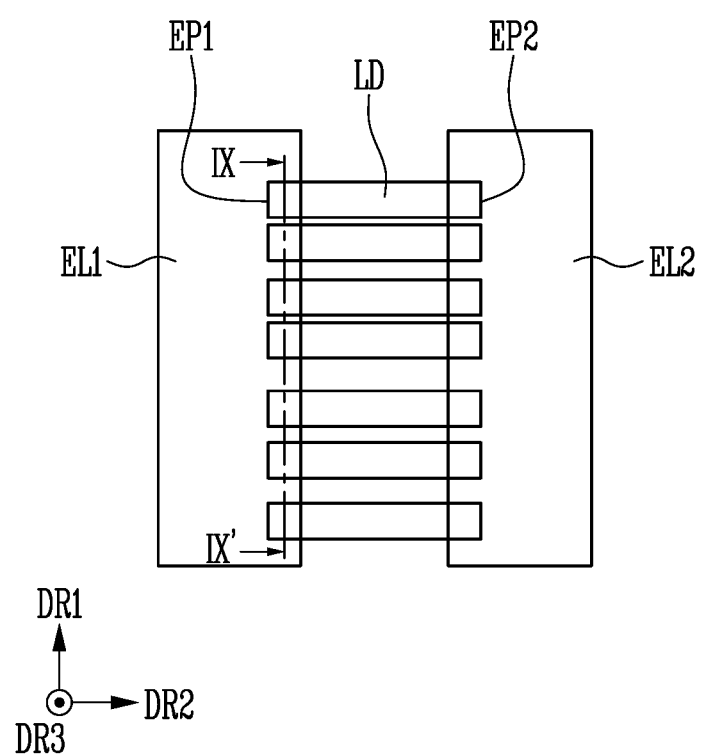
FIG. 7 illustrates a schematic top plan view of a partial area of a display device according to some embodiments.
Figure 8:
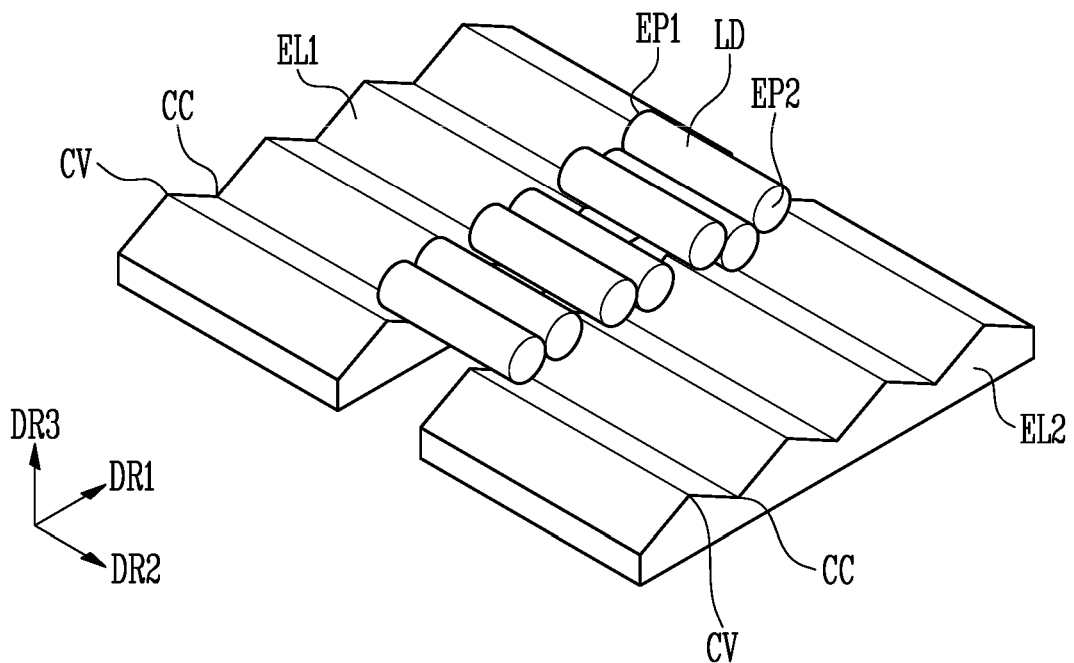
FIG. 8 illustrates a schematic perspective view of a partial area of a display device according to some embodiments.
Figure 9:
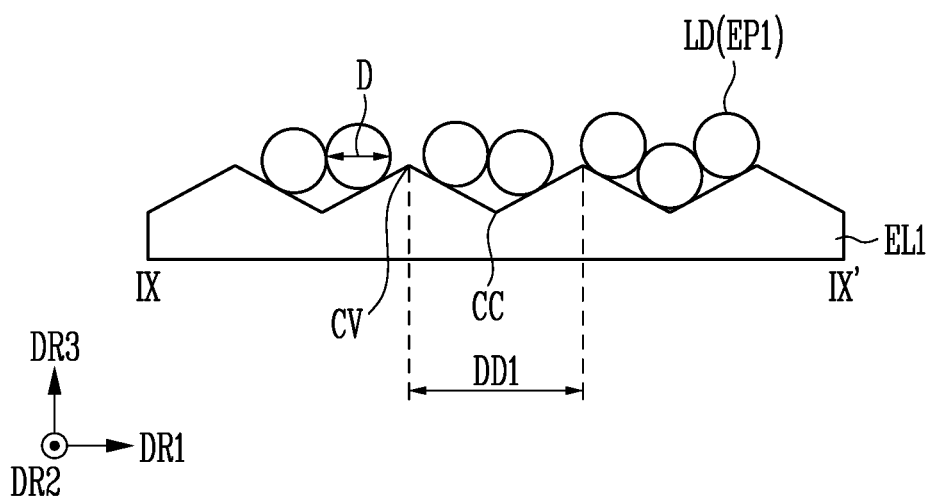
FIG. 9 illustrates a cross-sectional view taken along the line IX-IX' of FIG. 7.
Figure 10:
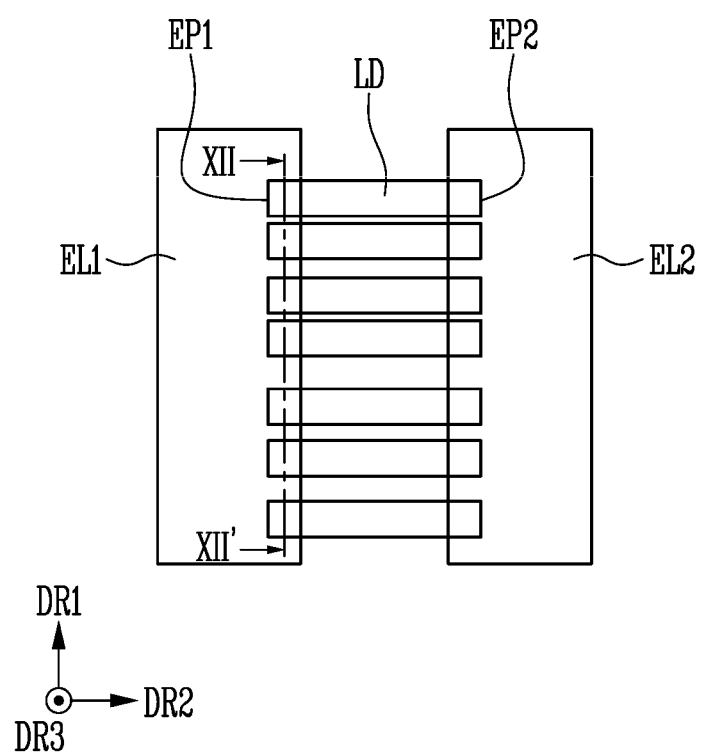
FIG. 10 illustrates a schematic top plan view of a partial area of a display device according to some embodiments.
Figure 11:
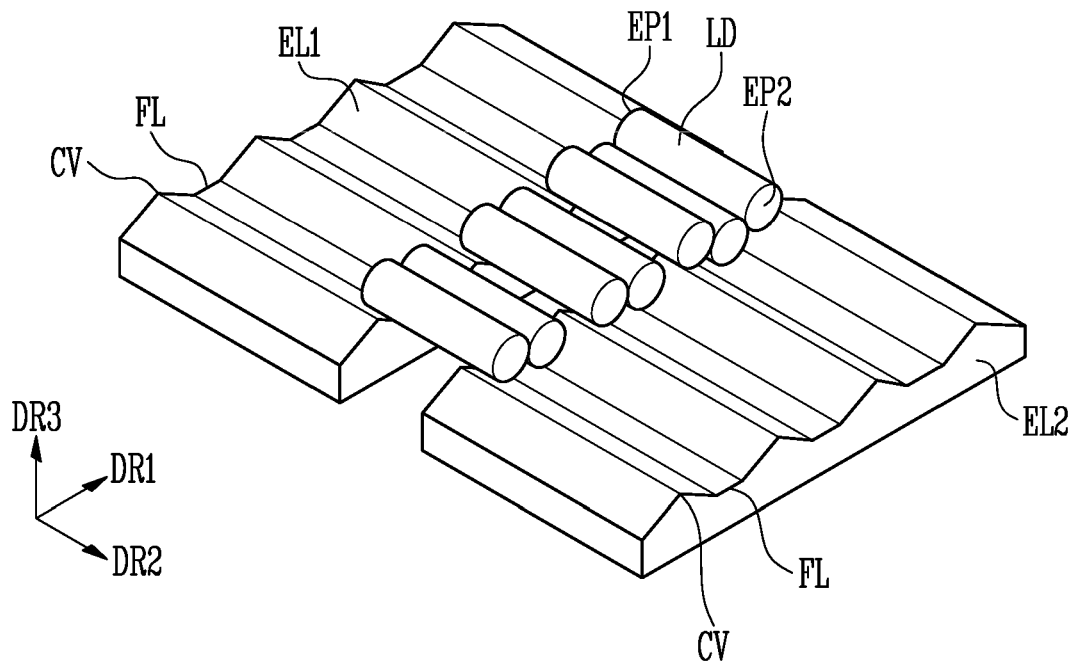
FIG. 11 illustrates a schematic perspective view of a partial area of a display device according to some embodiments.
Figure 12:
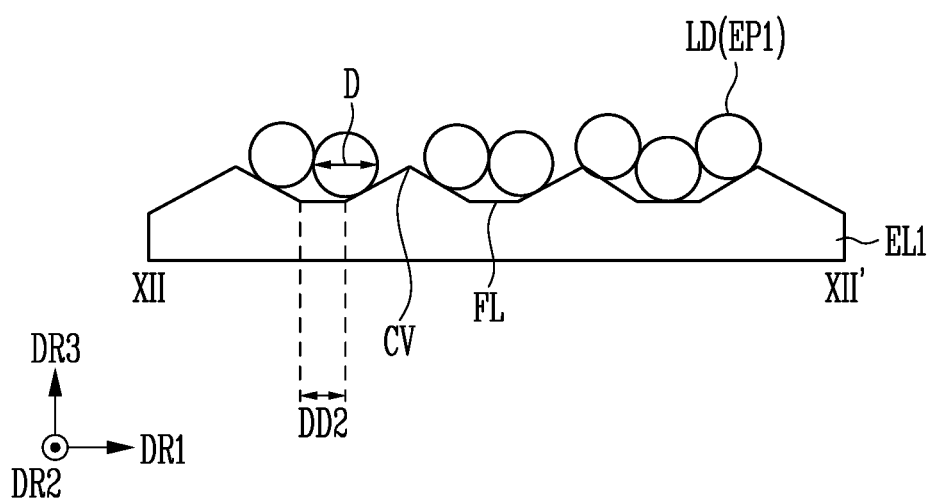
FIG. 12 illustrates a cross-sectional view taken along the line XII-XII' of FIG. 10.

FIG. 7 illustrates a schematic top plan view of a partial area of a display device according to some embodiments, FIG. 8 illustrates a schematic perspective view of a partial area of a display device according to some embodiments, and FIG. 9 illustrates a cross-sectional view taken along the line IX-IX' of FIG. 7. In addition, FIG. 10 illustrates a schematic top plan view of a partial area of a display device according to some embodiments, FIG. 11 illustrates a schematic perspective view of a partial area of a display device according to some embodiments, and FIG. 12 illustrates a cross-sectional view taken along the line XII-XII' of FIG. 10.

The first electrode EL1 and second electrode EL2 shown in FIG. 7 and FIG. 8 may correspond to portions of the first electrode EL1 and the second electrode EL2 of FIG. 5 described above. In addition, the first electrode EU and second electrode EL2 shown in FIG. 10 and FIG. 11 may correspond to portions of the first electrode EL1 and the second electrode EL2 of FIG. 5 described above.

First, referring to FIG. 7 and FIG. 8, when viewed in a plan view (for example, corresponding to a plane that is parallel to the first direction DR1 and the second direction DR2), the first electrode EL1 and the second electrode EL2 extend along the first direction DR1, and the first electrode EL1 and the second electrode EL2 are located to be spaced apart from each other along the second direction DR2.

The light emitting elements LD are located in parallel along the second direction DR2, which is a length direction, between the first electrode EU and the second electrode EL2 that are spaced apart from each other. The first end portion EP1 of the light emitting elements LD at least partially overlaps the first electrode EL1, and the second end portion EP2 of the light emitting elements LD at least partially overlaps the second electrode EL2. Accordingly, the first end portion EP1 of the light emitting elements LD may be electrically connected to the first electrode EU, and the second end portion EP2 of the light emitting elements LD may be electrically connected to the second electrode EL2. However, the present disclosure is not limited thereto, and the first end portion EP1 of the light emitting element LD may at least partially overlap the second electrode EL2 to be electrically connected thereto, and the second end portion EP2 of the light emitting element LD may at least partially overlap the first electrode EU to be electrically connected thereto.

Referring to FIG. 9, when viewed in a cross-sectional view (for example, with respect to the third direction DR3 that is perpendicular to the first direction DR1 and the second direction DR2), the first electrode EL1 includes concavo-convex portions in which at least a portion of the light emitting element LD is located. In some embodiments, the concavo-convex portions are shown as a shape in which triangles are continuously located in a cross-sectional view, but the present disclosure is not limited thereto. The concavo-convex portions may be a shape in which circles or semi-circles are continuously located in a cross-sectional view, or may be a shape in which polygons are continuously located in a cross-sectional view, and may be implemented in various shapes in which an upper surface of the first electrode EL1 (or second electrode EL2) is not flat but is instead uneven.

The concavo-convex portions include a plurality of convex portions CV and a plurality of concave portions CC. The plurality of convex portions CV and the plurality of concave portions CC may be alternately arranged along the first direction DR1. That is, a first convex portion, a first concave portion, a second convex portion, and a second concave portion may be sequentially arranged along the first direction DR1. In some embodiments, the concavo-convex portions formed in the first electrode EL1 are shown, but the concavo-convex portions may be also formed in the second electrode EL2. That is, in some embodiments, at least one of the first electrode EL1 and the second electrode EL2 may include the concavo-convex portions.

One or more light emitting elements LD are located or partially located between adjacent respective convex portions CV. That is, one or more light emitting element LD may be located on the concave portion CC located between the respective convex portions CV that are adjacent to each other. For example, two or three light emitting elements LD may be located between the first and second convex portions adjacent to each other. For example, two light emitting elements LD or three light emitting elements LD may be located on the first concave portion located between the first convex portion and the second convex portion that are adjacent to each other. A distance DD1 between adjacent convex portions CV may be larger than a diameter D of one light emitting element LD. This is to prevent a plurality of light emitting elements LD from being concentrated, and accordingly, two to three light emitting elements LD may be located between adjacent convex portions CV.

In some embodiments, because the first electrode EL1 and/or the second electrode EL2 include the concavo-convex portions having the plurality of concave portions CC and the plurality of convex portions CV, when a solution containing a plurality of light emitting elements LD is sprayed, the light emitting elements LD may be located at a relatively uniform density per unit area by the light emitting elements LD positioned in the concave portion CC.

In addition, when an alignment voltage (e.g., a predetermined alignment voltage or alignment signal) is applied to the first electrode EL1 and the second electrode EL2, a degree of freedom of electric field control increases in the third direction DR3, thereby improving the alignment of the light emitting elements LD.

That is, the display device according to some embodiments may reduce an alignment time for aligning the light emitting elements LD, and may form the light emitting elements LD at a uniform density per unit area.

Referring to FIG. 10 and FIG. 11, when viewed in a plan view (for example, a view corresponding to a plane that is parallel to the first direction DR1 and the second direction DR2), the first electrode EL1 and the second electrode EL2 extend along the first direction DR1, respectively, and the first electrode EL1 and the second electrode EL2 are located to be spaced apart from each other along the second direction DR2.

The light emitting elements LD are located in parallel along the second direction DR2, which is a length direction, between the first electrode EU and the second electrode EL2 that are spaced apart from each other. The first end portion EP1 of the light emitting elements LD at least partially overlaps the first electrode EL1, and the second end portion EP2 of the light emitting elements LD at least partially overlaps the second electrode EL2. Accordingly, the first end portion EP1 of the light emitting elements LD may be electrically connected to the first electrode EU, and the second end portion EP2 of the light emitting elements LD may be electrically connected to the second electrode EL2. However, the present disclosure is not limited thereto, and the first end portion EP1 of the light emitting element LD may at least partially overlap the second electrode EL2 to be electrically connected thereto, and the second end portion EP2 of the light emitting element LD may at least partially overlap the first electrode EU to be electrically connected thereto.

Referring to FIG. 12, when viewed in a cross-sectional view (for example, with respect to the third direction DR3 that is perpendicular to the first direction DR1 and the second direction DR2), the first electrode EL1 includes concavo-convex portions in which at least a portion of the light emitting element LD is located. In some embodiments, the concavo-convex portions formed in the first electrode EL1 are shown, but the concavo-convex portions may be formed in the second electrode EL2. That is, in some embodiments, at least one of the first electrode EL1 and the second electrode EL2 may include the concavo-convex portions.

The concavo-convex portions include a plurality of convex portions CV and a plurality of flat portions FL. The plurality of convex portions CV and the plurality of flat portions FL may be alternately arranged along the first direction DR1. That is, a first convex portion, a first flat portion, a second convex portion, and a second flat portion may be sequentially arranged along the first direction DR1.

In some embodiments, the convex portion is shown as a triangular shape in a cross-sectional view, but the present disclosure is not limited thereto. The convex portion may be circular or semi-circular in a cross-sectional view, or polygonal in a cross-sectional view, and may be implemented in various shapes in which an upper surface of the first electrode EL1 (or second electrode EL2) is not flat but uneven.

At least one light emitting element LD is located between the convex portions CV adjacent to each other. That is, one or more light emitting element LD may be located on the flat portion FL located between respective convex portions CV that are adjacent to each other. For example, two or three light emitting elements LD may be located between the first and second convex portions that are adjacent to each other. A width DD2 of the flat portion FL may be larger than or equal to the diameter D of one or more of the light emitting elements LD. This may prevent or reduce a number of light emitting elements LD from being concentrated, and a boundary portion of two adjacent light emitting elements LD may be located on the flat portion FL, and one light emitting element LD may be located thereon.

In some embodiments, because the first electrode EL1 and/or the second electrode EL2 include the concavo-convex portions having the convex portions CV and the flat portions FL, when a solution containing a plurality of light emitting elements LD is sprayed, the light emitting elements LD may be located at a relatively uniform density per unit area by the light emitting elements LD positioned in the flat portion FL.

In addition, when an alignment voltage (e.g., a predetermined alignment voltage) is applied to the first electrode EL1 and the second electrode EL2, a degree of freedom of electric field control increases in the third direction DR3, thereby improving the alignment of the light emitting elements LD.

That is, the display device according to some embodiments may reduce an alignment time for aligning the light emitting elements LD, and may form the light emitting elements LD at a uniform density per unit area.

Hereinafter, the first electrode and the second electrode used as alignment electrodes will be described with reference to FIG. 13 to FIG. 18.

Figure 13:
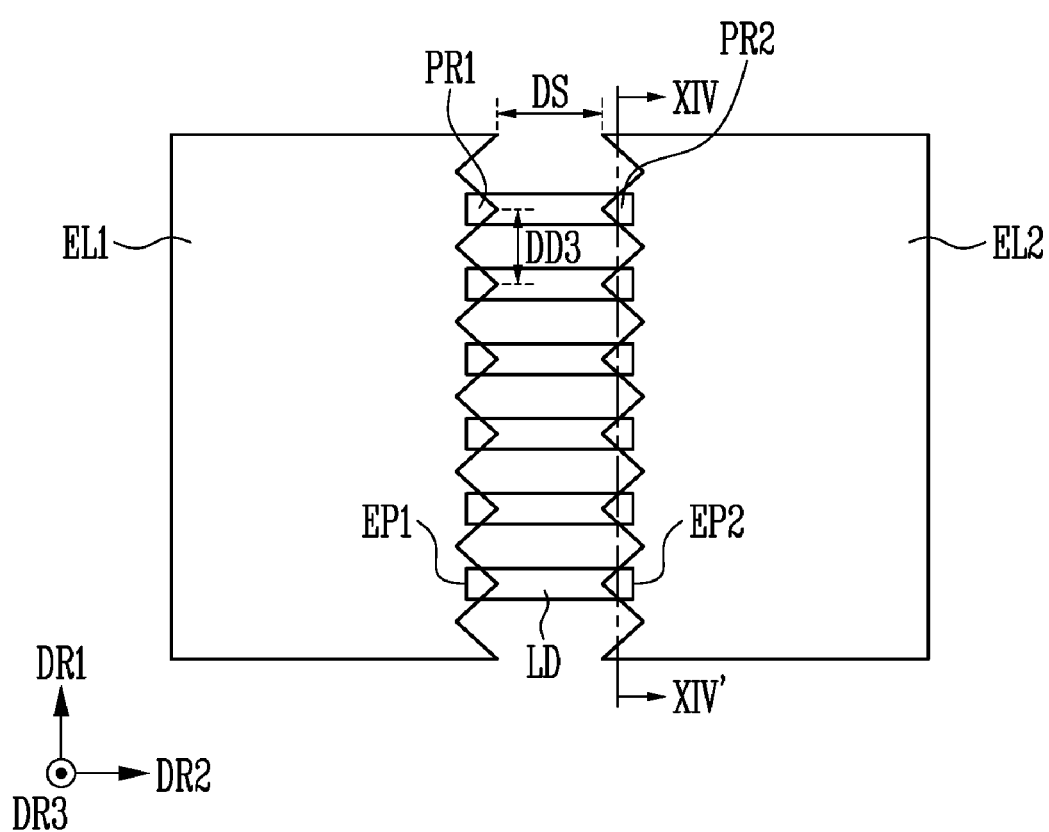
FIG. 13 illustrates a schematic top plan view of an example of a display device according to some embodiments.
Figure 14:
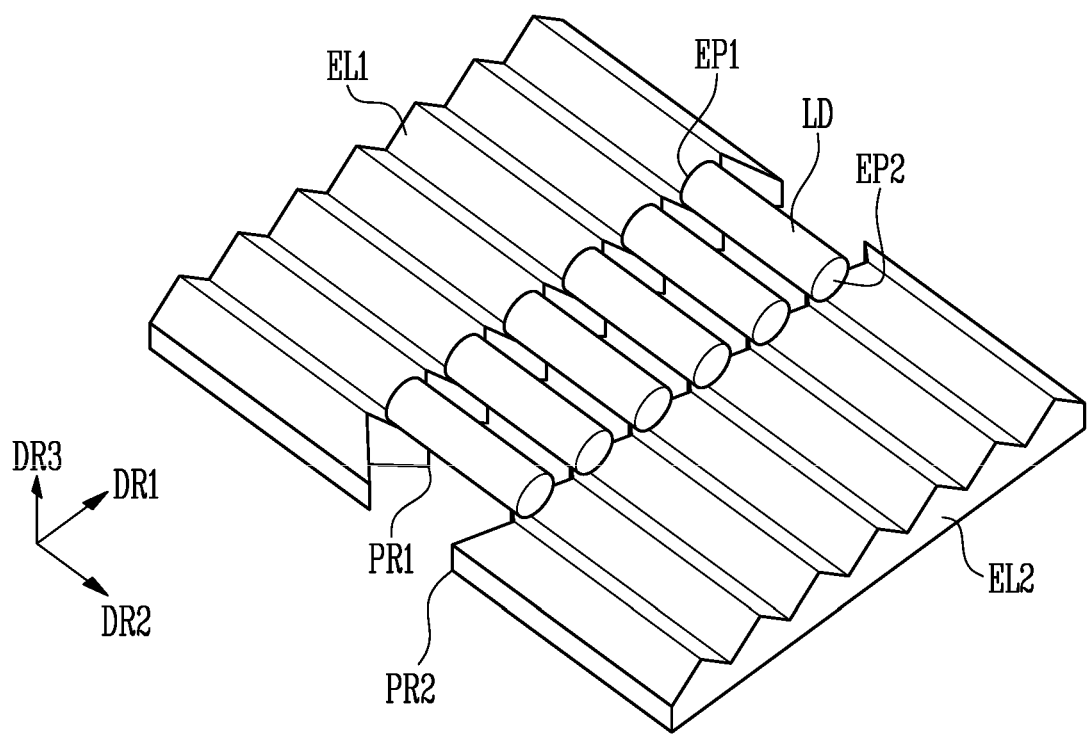
FIG. 14 illustrates a schematic perspective view of a partial area of a display device according to some embodiments.
Figure 15:
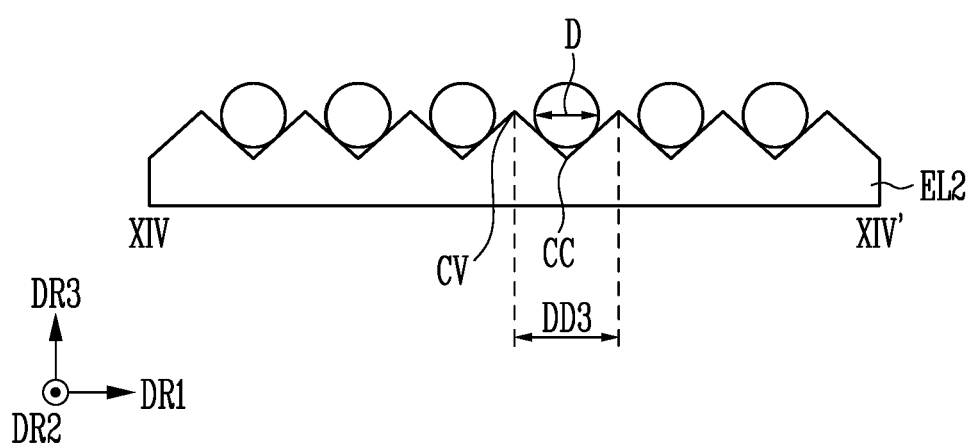
FIG. 15 illustrates a cross-sectional view taken along the line XIV-XIV' of FIG. 13.

FIG. 13 illustrates a schematic top plan view of an example of a display device according to some embodiments, FIG. 14 illustrates a schematic perspective view of a partial area of a display device according to some embodiments, FIG. 15 illustrates a cross-sectional view taken along the line XIV-XIV' of FIG. 13, and FIG. 16 to FIG. 18 illustrate schematic top plan views of an example of a display device according to some embodiments.

First, referring to FIG. 13 and FIG. 14, when viewed in a plan view, the first electrode EL1 and the second electrode EL2 extend along the first direction DR1, respectively, and the first electrode EL1 and the second electrode EL2 are located to be spaced apart from each other along the second direction DR2.

The first electrode EL1 includes a plurality of first protruding portions PR1 protruding from the first electrode EL1 toward the second electrode EL2 along the second direction DR2. The plurality of first protruding portions PR1 may be spaced apart from each other along the first direction DR1. The plurality of first protruding portion PR1 may be implemented in the same size and shape with each other. A distance DD3 between a vertex of a preceding first protruding portion PR1 and a vertex of a following first protruding portion PR1 among two first protruding portions PR1 that are successively located in the first direction DR1 may be larger than or equal to the diameter D of the light emitting element LD.

In addition, the second electrode EL2 includes a plurality of second protruding portions PR2 protruding from the second electrode EL2 toward the first electrode EL1 along the second direction DR2. The plurality of second protruding portions PR2 may be spaced apart from each other along the first direction DR1. A distance between a vertex of a preceding second protruding portion PR2 and a vertex of a following second protruding portion PR2 among two second protruding portions PR2 successively located in the first direction DR1 may be larger than or equal to the diameter D of the light emitting element LD.

In some embodiments, the first protruding portion PR1 and the second protruding portion PR2 are shown in a triangular shape in a plan view, but the present disclosure is not limited thereto. The first protruding portion PR1 and the second protruding portion PR2 may be circular or semicircular in a plan view, or may be polygonal in a plan view, and may be implemented in various shapes in which a side surface of the first electrode EL1 (or second electrode EL2) is not flat but is instead uneven.

The first protruding portion PR1 of the first electrode EL1 and the second protruding portion PR2 of the second electrode EL2 may be located to be spaced apart from each other along the second direction DR2 and to face each other. A distance DS between the first protruding portion PR1 and the second protruding portion PR2 may be larger than or equal to the length L (see FIG. 1 and FIG. 2) of the light emitting element LD.

The light emitting elements LD are located so as to be parallel along the second direction DR2, which is a length direction, between the first protruding portion PR1 and the second protruding portion PR2 facing each other.

The first end portion EP1 of the light emitting elements LD at least partially overlaps the first protruding portion PR1 of the first electrode EL1, and the second end portion EP2 of the light emitting elements LD at least partially overlaps the second protruding portion PR2 of the second electrode EL2. Accordingly, the first end portion EP1 of the light emitting elements LD may be electrically connected to the first electrode EL1, and the second end portion EP2 of the light emitting elements LD may be electrically connected to the second electrode EL2. However, the present disclosure is not limited thereto, and the first end portion EP1 of the light emitting element LD may at least partially overlap the second electrode EL2 to be electrically connected thereto, and the second end portion EP2 of the light emitting element LD may at least partially overlap the first electrode EL1 to be electrically connected thereto.

In some embodiments, when the alignment voltage (or alignment signal) is applied to the first electrode EU and the second electrode EL2, self-alignment of the light emitting elements LD may be induced due to an electric field formed between the first electrode EL1 and the second electrode EL2. In this case, the electric field may be concentrated in the first protruding portion PR1 of the first electrode EL1 and the second protruding portion PR2 of the second electrode EL2. For example, the electric field may be concentrated in maximally protruding portions (for example, vertex portions) of the first protruding portions PR1 and second protruding portion PR2. That is, as electric field concentration points are formed in the maximally protruding portions of the first protruding portion PR1 of the first electrode EL1 and of the second protruding portion PR2 of the second electrode EL2, the light emitting elements LD between the first electrode EL1 and the second electrode EL2 may be effectively aligned.

In addition, because a non-uniform electric field may be formed between the first electrode EL1 and the second electrode EL2 by the first protruding portion PR1 and the second protruding portion PR2, the light emitting elements LD may be suitably aligned. Therefore, the display device according to some embodiments may reduce the alignment time for aligning the light emitting elements LD.

Referring to FIG. 15, the second protruding portion PR2 of the second electrode EL2 includes concavo-convex portions in which at least some of the light emitting elements LD are located, in a cross-sectional view. In some embodiments, the concavo-convex portions formed in the second electrode EL2 are shown, but the concavo-convex portions may be formed in the first electrode EL1. That is, in some embodiments, at least one of the first electrode EU and the second electrode EL2 may include the concavo-convex portions.

The concavo-convex portions of the second protruding portion PR2 shown in FIG. 15 are the same as the concavo-convex portions of FIG. 9 described above, so a repeated detailed description thereof is omitted. In some embodiments, it is illustrated that the concavo-convex portions include only the plurality of convex portions and the plurality of concave portions, but in some embodiments, the second protruding portion PR2 and/or the first protruding portion PR1 of FIG. 15 may be implemented in the shape of the concavo-convex portions shown in FIG. 12.

Accordingly, in some embodiments, because the first electrode EL1 and/or the second electrode EL2 include the concavo-convex portions having the plurality of concave portions CC and the plurality of convex portions CV, when a solution containing a plurality of light emitting elements LD is sprayed, the light emitting elements LD may be located at a relatively uniform density per unit area by the light emitting elements LD positioned in the concave portion CC.

In addition, when an alignment voltage (e.g., a predetermined alignment voltage) is applied to the first electrode EL1 and the second electrode EL2, a degree of freedom of electric field control increases in the third direction DR3, thereby improving the alignment of the light emitting elements LD.

That is, the display device according to some embodiments may reduce an alignment time for aligning the light emitting elements LD, and may form the light emitting elements LD at a uniform density per unit area.

Figure 16:
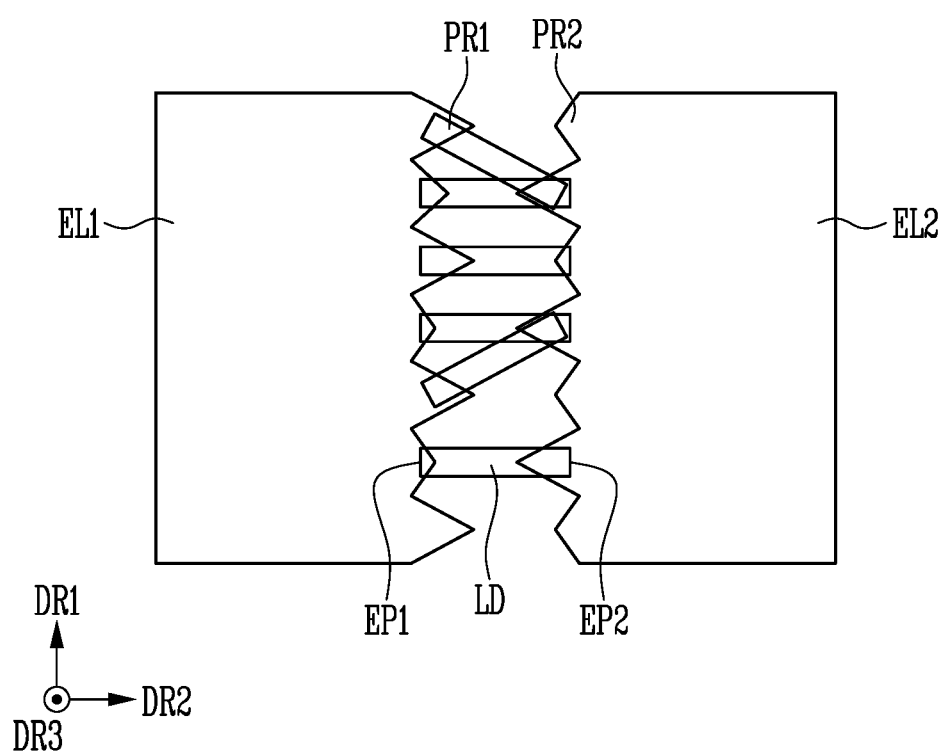
FIG. 16 to FIG. 18 illustrate schematic top plan views of an example of a display device according to some embodiments.

Referring to FIG. 16, when viewed in a plan view, the first electrode EL1 and the second electrode EL2 extend along the first direction DR1, respectively, and the first electrode EL1 and the second electrode EL2 are located to be spaced apart from each other along the second direction DR2.

The first electrode EL1 includes a plurality of first protruding portions PR1 protruding from the first electrode EL1 toward the second electrode EL2 along the second direction DR2. The plurality of first protruding portions PR1 may be spaced apart from each other along the first direction DR1. The plurality of first protruding portion PR1 may be implemented in different sizes and shapes.

In addition, the second electrode EL2 includes a plurality of second protruding portions PR2 protruding from the second electrode EL2 toward the first electrode EL1 along the second direction DR2. The plurality of second protruding portions PR2 may be spaced apart from each other along the first direction DR1. The plurality of second protruding portion PR2 may be implemented in different sizes and shapes.

The first protruding portions PR1 of the first electrode EL1 and the second protruding portions PR2 of the second electrode EL2 may be located to be spaced apart from each other along the second direction DR2, and may be located to be staggered with respect to each other.

The light emitting elements LD may be located so as to be parallel the each other with respect to the second direction DR2, which is a length direction, between the first protruding portion PR1 and the second protruding portion PR2 that are located to be staggered to each other. In addition, the light emitting elements LD may be obliquely located to have an angle (e.g., a predetermined angle) between the second direction DR2 and the length direction of the light emitting elements LD.

The first end portion EP1 of the light emitting elements LD at least partially overlaps the first protruding portion PR1 of the first electrode EL1, and the second end portion EP2 of the light emitting elements LD at least partially overlaps the second protruding portion PR2 of the second electrode EL2. Accordingly, the first end portion EP1 of the light emitting elements LD may be electrically connected to the first electrode EL1, and the second end portion EP2 of the light emitting elements LD may be electrically connected to the second electrode EL2. For example, the first end portion EP1 of one light emitting element LD may at least partially overlap one first protruding portion PR1, and the second end portion EP2 of one light emitting element LD may at least partially overlap one second protruding portion PR2. For example, the first end portion EP1 of another light emitting element LD may at least partially overlap another first protruding portion PR1, and the second end portion EP2 of another light emitting element LD may at least partially overlap the one second protruding portion PR2 (e.g., the first end portion EP1 of a light emitting element LD may overlap a first protruding portion PR1 that is staggered from, or that does not directly face, a second protruding portion PR2 that is overlapped by the second end portion EP2 of the same light emitting element LD). The light emitting elements LD may be closely and densely located between the first protruding portion PR1 and the second protruding portion PR2, and may be located so that respective first end portions EP1 or second end portions EP2 overlap each other.

In some embodiments, when an alignment voltage (or alignment signal) is applied to the first electrode EU and the second electrode EL2, an electric field may be concentrated in the first protruding portion PR1 of the first electrode EL1 and the second protruding portion PR2 of the second electrode EL2. For example, the electric field may be concentrated in maximally protruding portions (for example, vertex portions) of the first protruding portions PR1 and second protruding portion PR2. That is, as electric field concentration points are formed in the maximally protruding portions of the first protruding portion PR1 of the first electrode EL1 and of the second protruding portion PR2 of the second electrode EL2, the light emitting elements LD between the first electrode EL1 and the second electrode EL2 may be effectively aligned.

In addition, because a non-uniform electric field may be formed between the first electrode EL1 and the second electrode EL2 by the first protruding portion PR1 and the second protruding portion PR2, the light emitting elements LD may be aligned. Therefore, the display device according to some embodiments may reduce the alignment time for aligning the light emitting elements LD.

Figure 17:
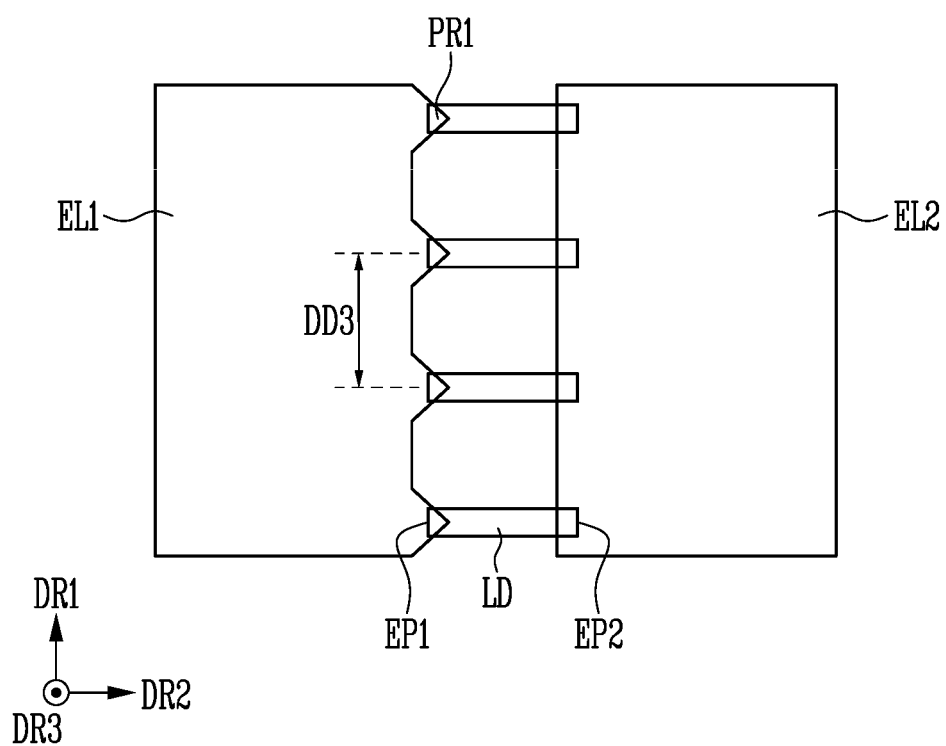
Figure 18:
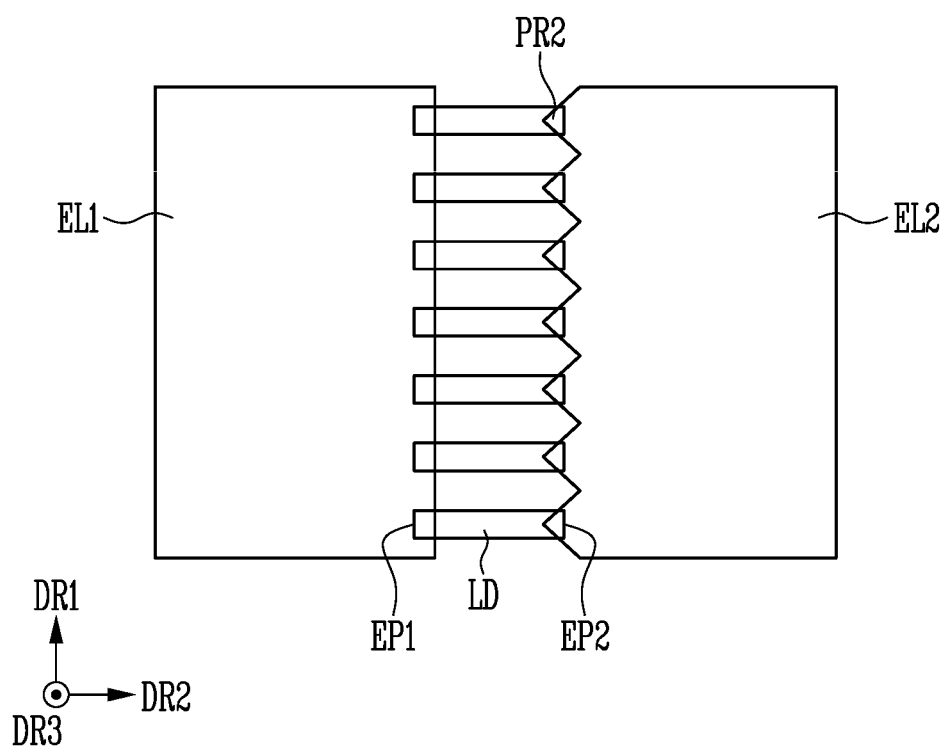

Referring to FIG. 17 and FIG. 18, when viewed in a plan view, the first electrode EL1 and the second electrode EL2 extend along the first direction DR1, respectively, and the first electrode EL1 and the second electrode EL2 are located to be spaced apart from each other along the second direction DR2.

Referring to FIG. 17, the first electrode EL1 includes a plurality of first protruding portions PR1 protruding from the first electrode EU toward the second electrode EL2 along the second direction DR2 (e.g., a second electrode EL2 not having protruding portions). The plurality of first protruding portions PR1 may be spaced apart from each other along the first direction DR1. The plurality of first protruding portion PR1 may be implemented in the same size and shape with each other. A distance DD3 between the first protruding portions PR1 that are spaced apart from each other may be larger than or equal to the diameter D of the light emitting element LD.

Referring to FIG. 18, the second electrode EL2 includes a plurality of second protruding portions PR2 protruding from the second electrode EL2 toward the first electrode EL1 along the second direction DR2 (e.g., toward the first electrode EL1 not having protruding portions). The plurality of second protruding portions PR2 may be spaced apart from each other along the first direction DR1. The plurality of second protruding portion PR2 may be implemented in the same size and shape with each other. A distance DD3 between the second protruding portions PR2 that are spaced apart from each other may be larger than or equal to the diameter D (see FIG. 15) of the light emitting element LD.

In some embodiments, when an alignment voltage (or alignment signal) is applied to the first electrode EU and the second electrode EL2, an electric field may be concentrated in the first protruding portion PR1 of the first electrode EL1 or the second protruding portion PR2 of the second electrode EL2. For example, the electric field may be concentrated in maximally protruding portions (for example, vertex portions) of the first protruding portions PR1 or second protruding portions PR2. That is, as electric field concentration points are formed in the maximally protruding portions of the first protruding portion PR1 of the first electrode EL1 or of the second protruding portion PR2 of the second electrode EL2, the light emitting elements LD between the first electrode EL1 and the second electrode EL2 may be suitably aligned. Therefore, the display device according to some embodiments may reduce the alignment time for aligning the light emitting elements LD.

While the present disclosure has been shown and described with reference to certain embodiments thereof, it will be understood by those skilled in the art that various changes in forms and details may be made therein without departing from the spirit and scope of the present disclosure as defined by the appended claims, the functional equivalents thereof to be included therein.

Therefore, the technical scope of the present disclosure may be determined based on the scope of the accompanying claims and their functional equivalents.

What is claimed is:

1. A display device comprising:
a base layer;
a first electrode and a second electrode extending along a first direction on the base layer, and spaced apart from each other in a second direction crossing the first direction; and
light emitting elements at least partially overlapping the first electrode and at least partially overlapping the second electrode,
wherein at least one of the first electrode and the second electrode comprises a concavo-convex portion in which at least a portion of one of the light emitting elements overlaps with respect to a third direction that is perpendicular to the first direction and to the second direction, the concavo-convex portion comprising concave portions extending along the second direction, and convex portions extending along the second direction, and adjacent to respective ones of the concave portions in the first direction.

2. The display device of claim 1, wherein the concavo-convex portion comprises concave portions and convex portions.

3. The display device of claim 2, wherein the concave portions and the convex portions are alternately arranged along the first direction.

4. The display device of claim 3, wherein the portion of the one of the light emitting elements is located between two adjacent convex portions of the first electrode or two adjacent convex portions of the second electrode.

5. The display device of claim 1, wherein the one of the light emitting elements comprises a first end portion that at least partially overlaps the first electrode to be electrically connected to the first electrode, and a second end portion that at least partially overlaps the second electrode to be electrically connected with the second electrode.

6. The display device of claim 5, wherein the concavo-convex portion at least partially overlaps the first end portion or the second end portion of the one of the light emitting elements.

7. The display device of claim 1, wherein the concavo-convex portion comprises at least one flat portion positioned between two adjacent ones of the convex portions.

8. The display device of claim 7, wherein the convex portions and the at least one flat portion are alternately arranged along the first direction.

9. The display device of claim 7, wherein at least one light emitting element of the light emitting elements is located on the at least one flat portion.

10. The display device of claim 9, wherein the one of the light emitting elements comprises a first end portion that at least partially overlaps the first electrode to be electrically connected to the first electrode, and a second end portion that at least partially overlaps the second electrode to be electrically connected with the second electrode, and
wherein the flat portion at least partially overlaps the first end portion or the second end portion of the one of the light emitting elements.

* * * * *